(12) United States Patent
Torii (10) Patent No.: US 8,125,364 B2
(45) Date of Patent: Feb. 28, 2012

(54) DATA COMPRESSION/DECOMPRESSION METHOD

(75) Inventor: Sunao Torii, Minato-ku (JP)

(73) Assignee: NEC Corporation, Tokyo (JP)

( * ) Notice: Subject to any disclaimer, the term of this patent is extended or adjusted under 35 U.S.C. 154(b) by 196 days.

(21) Appl. No.: 12/673,459

(22) PCT Filed: Jul. 24, 2008

(86) PCT No.: PCT/JP2008/063282
§ 371 (c)(1),
(2), (4) Date: Feb. 12, 2010

(87) PCT Pub. No.: WO2009/022531
PCT Pub. Date: Feb. 19, 2009

(65) Prior Publication Data
US 2011/0199241 A1    Aug. 18, 2011

(30) Foreign Application Priority Data
Aug. 13, 2007  (JP) ................... 2007-210761

(51) Int. Cl.
*H03M 7/34* (2006.01)
(52) U.S. Cl. ............ 341/151; 341/65; 341/67; 341/106; 341/107; 341/59
(58) Field of Classification Search .............. 341/51, 341/59, 65, 67, 106, 107; 375/240.03, 240.12, 375/240.01, 240.02, 242.232; 382/245, 232, 382/233, 234, 162, 166
See application file for complete search history.

(56) References Cited

U.S. PATENT DOCUMENTS

| | | | | |
|---|---|---|---|---|
| 6,271,775 B1 * | 8/2001 | Jaquette et al. | ............... | 341/87 |
| 6,650,784 B2 * | 11/2003 | Thyagarajan | ................ | 382/244 |
| 7,016,547 B1 * | 3/2006 | Smirnov | ...................... | 382/245 |
| 7,245,235 B2 * | 7/2007 | Malvar | ........................... | 341/51 |
| 7,355,531 B2 * | 4/2008 | Lai et al. | ....................... | 341/51 |
| 7,433,824 B2 * | 10/2008 | Mehrotra et al. | ............ | 704/501 |
| 7,555,167 B2 * | 6/2009 | Srinivasan et al. | ............ | 382/239 |
| 7,840,403 B2 * | 11/2010 | Mehrotra et al. | ............ | 704/222 |
| 2005/0015249 A1 * | 1/2005 | Mehrotra et al. | ............ | 704/230 |
| 2006/0012496 A1 * | 1/2006 | Kang et al. | ..................... | 341/59 |
| 2010/0225506 A1 * | 9/2010 | Chen et al. | ..................... | 341/51 |

FOREIGN PATENT DOCUMENTS

| | | |
|---|---|---|
| JP | 2-288739 A | 11/1990 |
| JP | 07-203215 A | 8/1995 |
| JP | 08-018981 A | 1/1996 |
| JP | 10-105372 A | 4/1998 |
| JP | 10-243131 A | 9/1998 |
| JP | 2001-257888 A | 9/2001 |
| JP | 2003-521189 A | 7/2003 |
| JP | 2003-234910 A | 8/2003 |
| JP | 3653226 B2 | 3/2005 |

* cited by examiner

*Primary Examiner* — Linh Nguyen
(74) *Attorney, Agent, or Firm* — Sughrue Mion, PLLC (57) ABSTRACT

A compression engine starts compressing data by a preset first compression rule, compresses the following data by a second compression rule when the characteristics of the data satisfy a predetermined switching condition, and returns to the first compression rule when the characteristics of the data do not satisfy the switching condition to compress the data and the following data. A decompression engine starts decompressing compressed data by a first decompression rule corresponding to the first compression rule, decompresses the following compressed data by a second decompression rule corresponding to the second compression rule when the characteristics of the data after decompression satisfy the switching condition, and returns to the first decompression rule when the characteristics of the data after decompression do not satisfy the switching condition to decompress the data and the following compressed data.

9 Claims, 6 Drawing Sheets

DATA COMPRESSION/DECOMPRESSION METHOD

TECHNICAL FIELD

The present invention relates to a data compression/decompression method suitable for use in an information processing apparatus, such as a microprocessor, SOC (System On a Chip), and ASIC, that holds and refers to data.

BACKGROUND ART

In a processor, SOC, and the like used for information processing, an on-chip or off-chip SRAM or SDRAM, a hard disk apparatus, or a storage device such as a flash memory, are used to apply predetermined processing to data.

As the information processing speeds up, the storage capacity required for processing increases, and the cost for semiconductor memories, such as on-chip or off-chip SRAM or SDRAM, also increases. It is also difficult to accommodate a memory with desired capacity within a certain size of package. Therefore, a data compression technique for reducing the size of redundant data to be processed and a data decompression technique for decompressing compressed data are essential in an information processing apparatus that requires high efficiency and high cost-effectiveness.

An LZ method (slide dictionary method) is conventionally known in a typical data compression/decompression process. In the LZ method, a dictionary is searched to check whether compression target data has appeared before. If the compression target data has appeared before, the data is replaced by information indicating an entry number of a storage location in the dictionary and a match length with registered data. If the compression target data has not appeared before, the data is registered in the dictionary as mismatch data and outputted without change.

Figure 1:
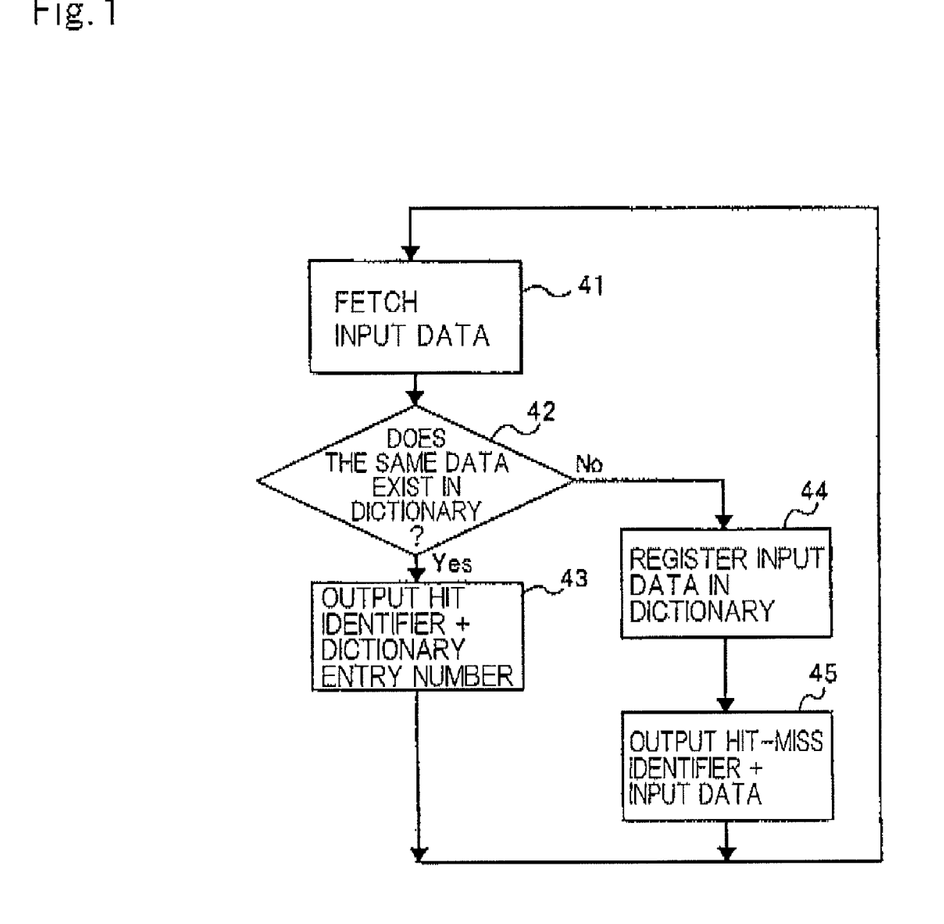
FIG. 1 is a flow chart showing a processing procedure of a dictionary-based compression method.

The dictionary used in the LZ method is called a slide dictionary because new data replaces old data to update the dictionary. The LZ method is also called a dictionary-based compression method because a dictionary is used for compression and is capable of efficient lossless compression utilizing reappearance of data. Therefore, the LZ method is widely used in the field of data compression. FIG. 1 illustrates a processing procedure of the dictionary-based compression method.

FIG. 1 is a flow chart showing a processing procedure of a dictionary-based compression method.

As shown in FIG. 1, in the dictionary-based compression method, compression target input data is first fetched in step 41, and a search is made to determine whether the same data as the input data exists in the dictionary is searched in step 42.

If the same data as the input data exists in the dictionary, the process moves to step 43. An input number provided to the input data is replaced by a number indicating the storage location of the same data in the dictionary (dictionary entry number), and the dictionary entry number and a hit identifier indicative of the existence of the same data in the dictionary are outputted. Here, if the number of bits required to express the dictionary entry number is smaller than the size of the input data, the compression process is carried out.

If the same data as the input data does not exist in the dictionary, the process moves to step 44 to register the input data in the dictionary. In step 45, a hit-miss identifier indicating that the same data does not exist in the dictionary is added to the input data and outputted.

To decompress the data, the dictionary is restored from the data provided with the hit-miss identifier, and the compressed data (dictionary entry number) provided with the hit identifier is replaced by corresponding data in the dictionary to reproduce the original data.

Figure 2:
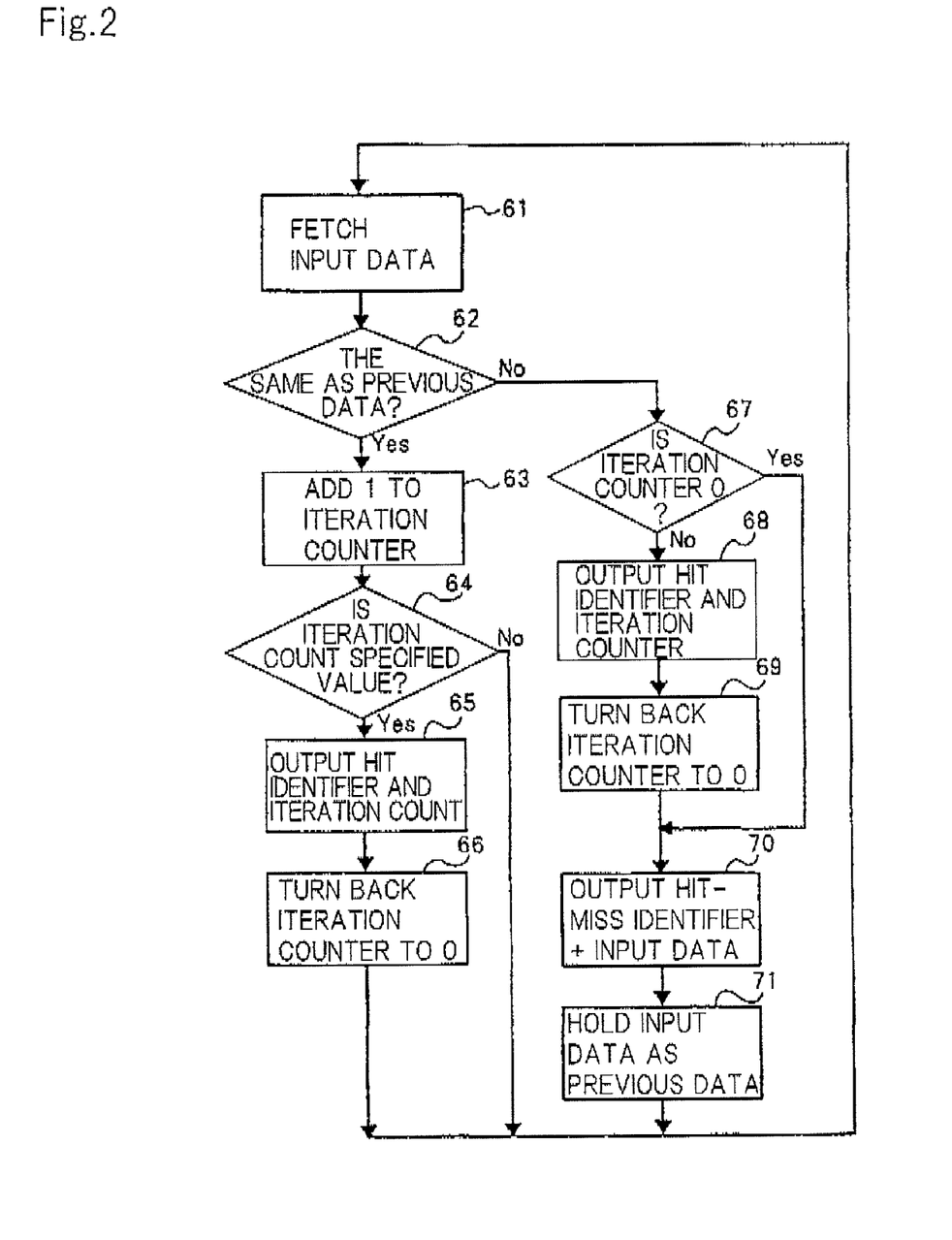
FIG. 2 is a flow chart showing a processing procedure of a compression method by RLE.

Meanwhile, a compression method called RLE (Run Length Encoding) is used for transmitting data using a facsimile device and the like. The RLE is a method for compressing data to be processed by replacing the data with information indicating the number of repetitions of the same data pattern. FIG. 2 illustrates a processing procedure of the compression method by RLE.

FIG. 2 is a flow chart showing a processing procedure of a compression method by RLE.

As shown in FIG. 2, in RLE, compression target input data is first fetched in step 61, and whether the input data is the same as the previous data is determined in step 62. If the input data is the same as the previous data, the process moves to step 63, and "1" is added to a value of a preset iteration counter.

Next, in step 64, whether the value of the iteration counter has reached a preset specified value is determined. If the value has reached the specified value, a hit identifier indicating that the input data is the same as the previous data and the value of the iteration counter are outputted in step 65, and the value of the iteration counter is returned to "0" in step 66.

If the value of the iteration counter has not reached the specified value in step S64, the process returns to step 61. The next input data is fetched, and the processes from step 62 are repeated.

If the input data is determined not the same as the previous data in step 62, whether the value of the iteration counter is "0" is checked in step 67. If the value of the iteration counter is not "0", the iteration count of the last time needs to be outputted. Therefore, a hit identifier and the value of the iteration counter are outputted in step 68, and the value of the iteration counter is returned to "0" in step 69. If the value of the iteration counter is 0, a hit-miss identifier indicating that the input data is not the same as the previous data and the input data are outputted without change in step 70. The input data is held as the previous data in step 71, and the process returns to step 61.

In this way, in the compression method by RLE, simple repetition characteristics included in a data string are used to compress data. Therefore, the compression method is effective for compressing image data and the like, but is not effective for normal calculation data and the like because the compression efficiency is not high enough. Therefore, it is preferable to use RLE by limiting the types of compression target data.

Consequently, a compression method with a combination of the LZ method and RLE is proposed in, for example, National Publication of International Patent Application No. 2003-521189 (hereinafter, called Patent Document 1) and Japanese Patent No. 3653226 (hereinafter, called Patent Document 2).

In Patent Document 1, a configuration is proposed in which an RLE coder that executes a compression process by the RLE is arranged at the latter part of a main coder that executes a dictionary-based compression process.

Figure 3:
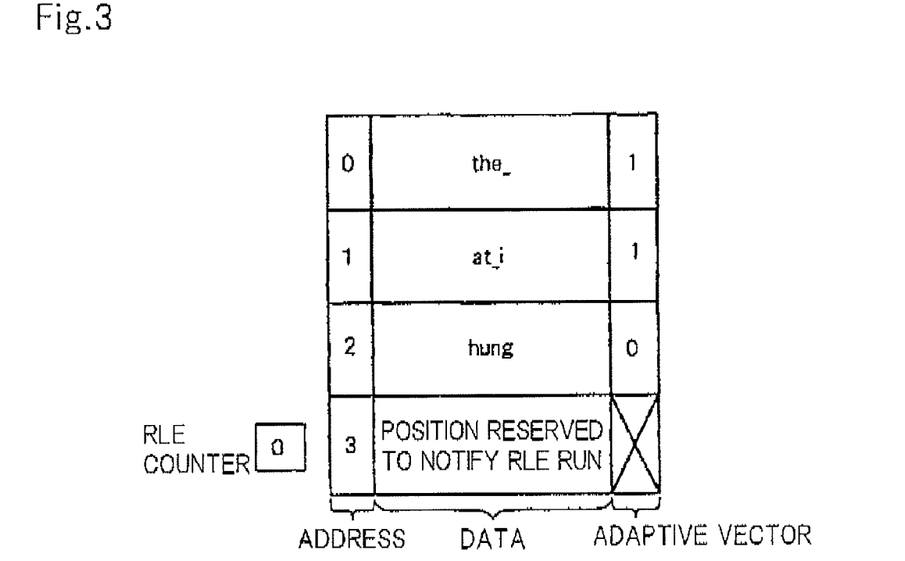
FIG. 3 is a schematic diagram showing an example of configuration of a dictionary used in a compression process described in Patent Document 1.

In Patent Document 1, information indicative of an RLE process is stored in a data storage area of the dictionary as shown in FIG. 3, and an entry number indicative of the area is used as a control code of the compression process by RLE. In the technique described in Patent Document 1, there is a problem in which the RLE coder needs to be always operated, and the RLE coder occupies part of the entries (data storage area with address 3 in FIG. 3) in the dictionary.

Meanwhile, Patent Document 2 describes a configuration for compressing data by the LZ method after compression of data by RLE. Patent Document 2 points out the low compression efficiency and the high processing cost of RLE and proposes a new compression method using RLE.

However, in a method with a combination of the dictionary-based compression method and another compression method (RLE or the like), processing circuits (such as logic circuit and CPU) that execute the compression process are always operated even if the compression method of the latter (RLE or the like) is not effective for the compression target data. Therefore, there is a problem in which power is unnecessarily consumed.

Furthermore, in a method that combines the dictionary-based compression method and the compression method of RLE, the RLE coder occupies part of the entries of the dictionary as described above. This causes a decrease in data compression efficiency. Particularly, compression efficiency decreases if the RLE compression method is not effective for the compression target data.

SUMMARY

An object of the present invention is to provide a data compression/decompression method that is capable of improving the compression efficiency to compress and decompress data having various characteristics and that is capable of reducing power consumption.

In an aspect of the present invention for achieving the above-described object, a compression engine is configured to:

start compressing data according to a first compression rule used at the start of a preset compression process of the data and analyze characteristics of the data;

when the characteristics of the data satisfy a preset switching condition, compress the following data according to a second compression rule different from the first compression rule; and when the characteristics of the data do not satisfy the switching condition, compress the data and the following data according to the first compression rule, and a decompression engine is configured to:

start decompressing compressed data according to a first decompression rule corresponding to the first compression rule;

when the characteristics of the data after decompression satisfy the switching condition, decompress the following compressed data according to a second decompression rule corresponding to the second compression rule; and when the characteristics of the data after decompression do not satisfy the switching condition, decompress the data and the following compressed data according to the first decompression rule.

EXEMPLARY EMBODIMENT

Next, the present invention will be described with reference to the drawings.

The present invention prepares a plurality of types of compression rules and decompression rules corresponding to the compression rules to allow handling various characteristics included in data. A switching condition of the compression rules corresponding to the characteristics of data is also defined. To compress data, the characteristics of the data are analyzed, and if the characteristics satisfy the switching condition, the compression rule is switched from the following data. Specifically, if the same data is consecutively inputted for a plurality of times, the compression rule is switched. Meanwhile, to decompress data, the characteristics of data after decompression are analyzed, and if the same switching condition as in the compression process is met, the decompression rule is switched from the following compressed data.

Although hardware, such as SOC (System On a Chip) and ASIC, and a microprocessor or a computer apparatus that executes a process according to a program can realize the data compression/decompression method of the exemplary embodiment, an example will be described below in which SOC 81 shown in FIG. 4 compresses/decompresses data.

Figure 4:
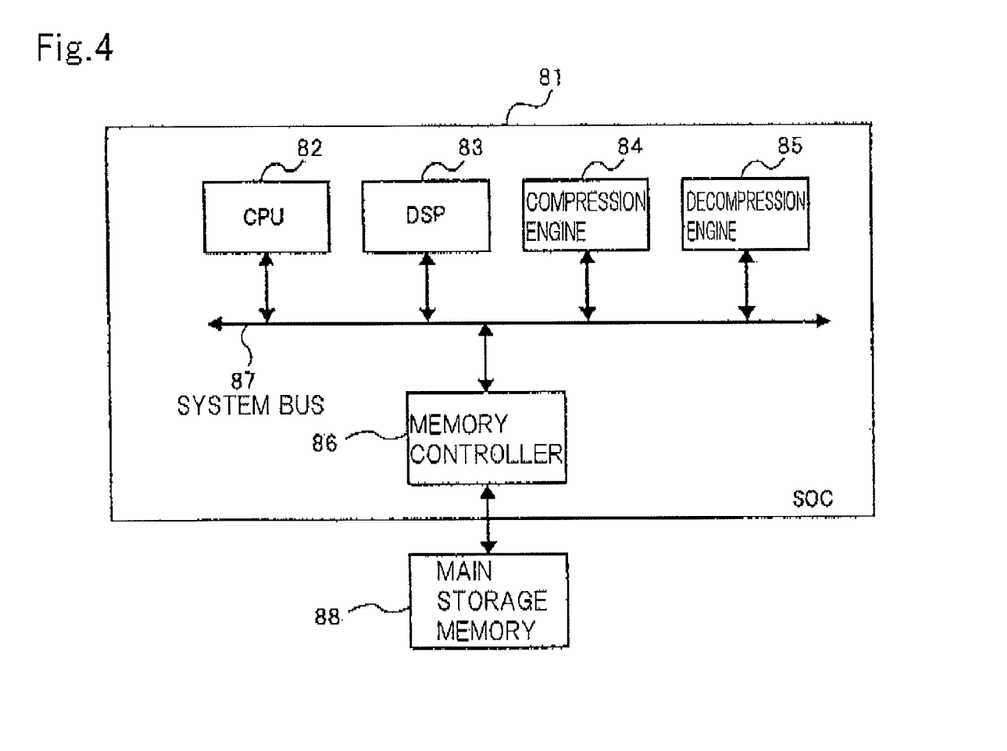
FIG. 4 is a block diagram showing an example of configuration of SOC applied with a data compression/decompression method of the present invention.

FIG. 4 is a block diagram showing an example of configuration of SOC applied with the data compression/decompression method of the present invention.

As shown in FIG. 4, SOC 81 comprises CPU 82, DSP 83, compression engine 84, decompression engine 85, and memory controller 86.

CPU 82, DSP 83, compression engine 84, and decompression engine 85 are connected to system bus 87 as bus masters. Memory controller 86 is connected to system bus 87 as a bus slave. Memory controller 86 is connected to main storage memory 88 included independently from SOC 81.

According to the configuration, CPU 82, DSP 83, compression engine 84, and decompression engine 85 can read/write data to and from main storage memory 88 through system bus 87 and memory controller 86. More specifically, compression engine 84 and decompression engine 85 can read out data from, for example, an address of main storage memory 88 designated by CPU 82, apply a compression or decompression process to the data, and write the processed data in an address of main storage memory 88 designated by CPU 82.

Figure 5:
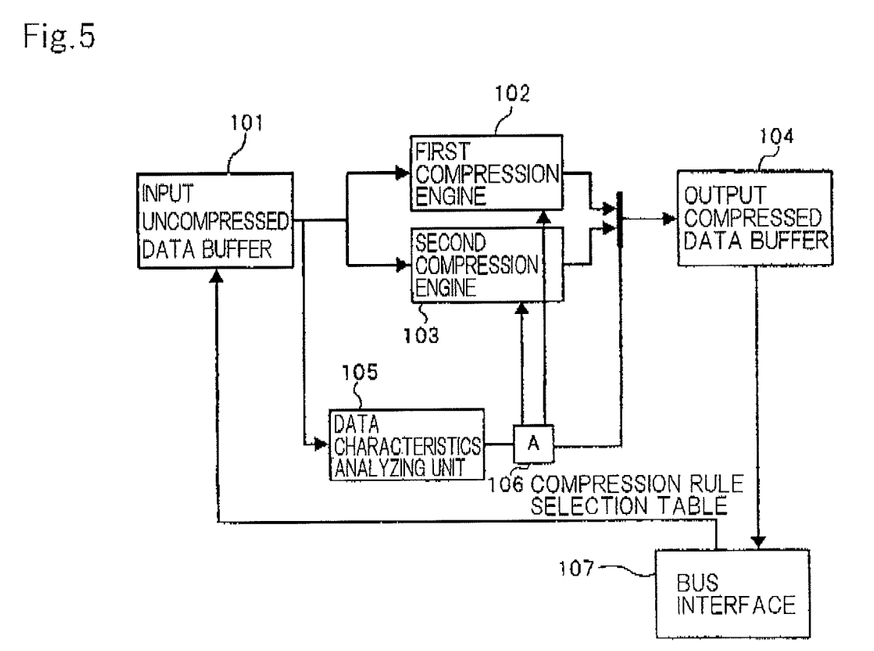
FIG. 5 is a block diagram showing an example of configuration of a compression engine shown in FIG. 4.
Figure 6:
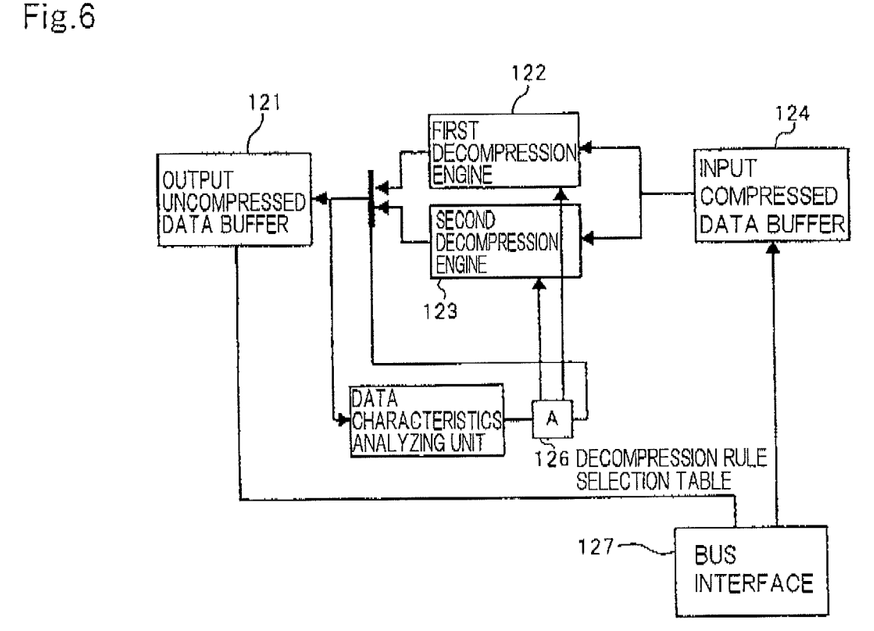
FIG. 6 is a block diagram showing an example of configuration of a decompression engine shown in FIG. 4.

FIG. 5 is a block diagram showing an example of configuration of the compression engine shown in FIG. 4, and FIG. 6 is a block diagram showing an example of configuration of the decompression engine shown in FIG. 4. The compression engine shown in FIG. 5 and the decompression engine shown in FIG. 6 are examples of a configuration for compressing/decompressing data in accordance with two types of compression rules (first compression rule and second compression rule).

In the exemplary embodiment, a compression process that is applied first to the compression target data will be referred to as the dictionary-based compression process (first compression rule), and a compression process to which the process is switched in the middle will be referred to as the RLE compression process (second compression rule).

As shown in FIG. 5, compression engine 84 comprises input uncompressed data buffer 101, first compression engine 102, second compression engine 103, output compressed data buffer 104, data characteristics analyzing unit 105, compression rule selection table 106, and bus interface 107.

Bus interface 107 reads out compression target data from, for example, an address of main storage memory 88 designated by CPU 82 and stores (fetches) the data to input uncompressed data buffer 101. The data stored in input uncompressed data buffer 101 is outputted to first compression engine 102, second compression engine 103, and data characteristics analyzing unit 105.

Data characteristics analyzing unit 105 stores the data received from input uncompressed data buffer 101 in a buffer, not shown, as previous data. When the characteristics of the data satisfy a preset switching condition, in other words, when the same data is received twice in a row from input uncompressed data buffer 101, a value of compression rule selection table 106 is changed to switch the compression rule. When the characteristics of the data do not satisfy the switching condition, in other words, when the consecutive same data changes to different data, the original value of compression rule selection table 106 is restored to switch the compression rule.

Compression rule selection table 106 holds a value "A" indicative of the first compression rule or a value "B" indicative of the second compression rule. When the value "A" is held, first compression engine 102 is activated, and when the value "B" is held, second compression engine 103 is activated.

Activated first compression engine 102 or second compression engine 103 compresses the data received from input uncompressed data buffer 101 in accordance with each compression rule and stores the data after compression in output compressed data buffer 104. First compression engine 102 comprises a dictionary and compresses the data by using the dictionary-based compression process (first compression rule). Second compression engine 103 comprises an iteration counter and compresses the data by using the RLE (second compression rule) compression process. Bus interface 107 writes the data stored in output compressed data buffer 104 into, for example, the address of main storage memory 88 designated by CPU 82.

As shown in FIG. 6, decompression engine 85 comprises input compressed data buffer 124, first decompression engine 122, second decompression engine 123, output uncompressed data buffer 121, data characteristics analyzing unit 125, decompression rule selection table 126, and bus interface 127.

Bus interface 127 reads out decompression target data (compressed data) from, for example, an address of main storage memory 88 designated by CPU 82 and stores (fetches) the data in input compressed data buffer 124. The data stored in input compressed data buffer 124 is outputted to first decompression engine 122 and second decompression engine 123.

Data characteristics analyzing unit 125 stores the data after decompression outputted from first decompression engine 122 or second decompression engine 123 in a buffer, not shown, as previous data. When the characteristics of the data satisfy a preset switching condition, in other words, when the same data succeeds twice, the value held in decompression rule selection table 126 is changed to switch the decompression rule. When the characteristics of the data do not satisfy the switching condition, in other words, when the consecutive same data changes to different data, the value of decompression rule selection table 126 is restored to the original value to switch the compression rule.

Decompression rule selection table 126 holds the value "A" indicative of the first decompression rule or the value "B" indicative of the second decompression rule. When the value "A" is held, first decompression engine 122 is activated, and when the value "B" is held, second decompression engine 123 is activated.

Activated first decompression engine 122 or second decompression engine 123 decompresses the compressed data received from input compressed data buffer 124 and stores the data after compression in output uncompressed data buffer 121. First decompression engine 122 comprises a dictionary and restores compressed data by the first decompression process corresponding to the dictionary-based compression process (first compression rule). Second decompression engine 123 comprises an iteration counter and restores the compressed data by a second decompression process corresponding to the RLE (second compression rule) compression process. Bus interface 127 writes the data stored in output uncompressed data buffer 121 into, for example, an address of main storage memory 88 designated by CPU 82.

Although the exemplary embodiment illustrates an example of configuration including compression engine 84 and decompression engine 85 as individual modules in SOC 81, compression engine 84 and decompression engine 85 may be configured to share various buffers or hardware of the engine.

Next, a processing procedure of the data compression/decompression method of the present invention will be described using the drawings.

First, a processing procedure of a data compression method of the present invention will be described using FIG. 7.

Figure 7:
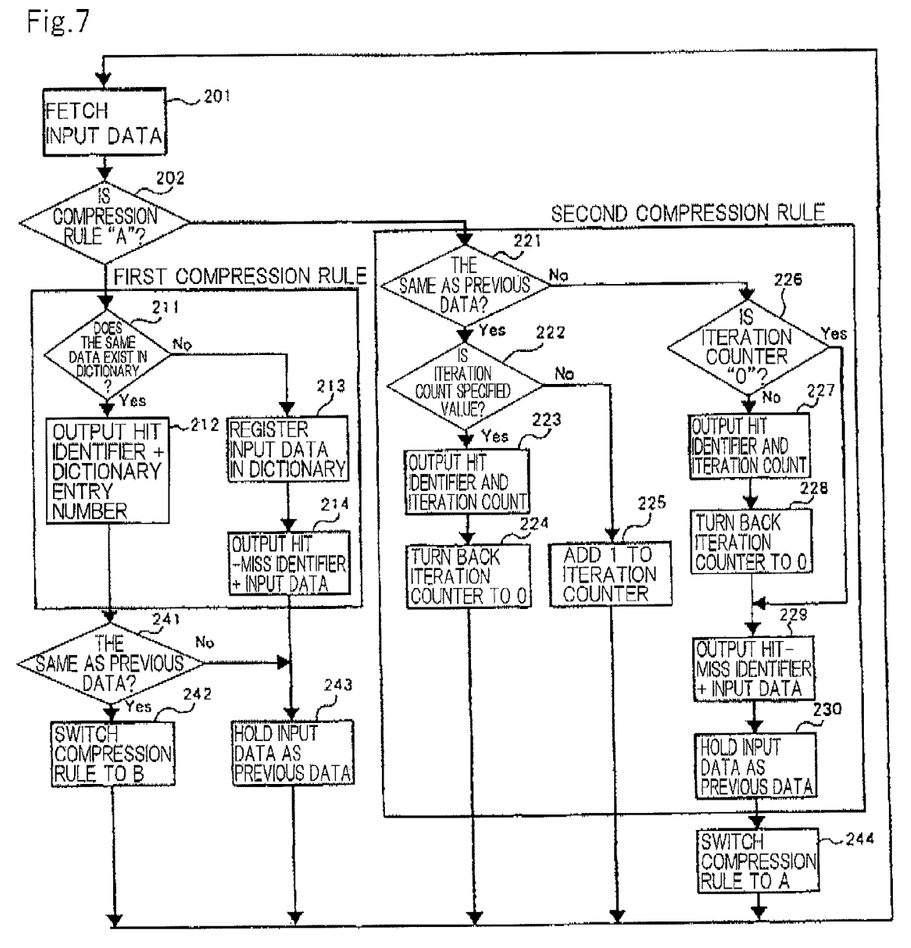
FIG. 7 is a flow chart showing an example of a processing procedure of a compression method of the present invention.

FIG. 7 is a flow chart showing an example of a processing procedure of the compression method of the present invention. Here, an example of compressing data (input data) with addresses 1 to 12 shown in Table 1 below byte by byte will be described. Data after compression (compressed data) is described in the rightmost column of Table 1.
[Table 1]

In the exemplary embodiment, the first compression rule is used at the start of the compression process. Therefore, compression rule selection table 106 stores in advance the value "A" indicative of the first compression rule.

When the compression process starts, compression engine 84 first fetches input data 0x32 with address 1 to input uncompressed data buffer 101 in step 201 and determines whether the compression rule is the first compression rule in step 202. Here, since the value of compression rule selection table 106 is "A", first compression engine 102 starts the compression process.

First compression engine 102 determines in step 211 whether the same data as the input data exists in the dictionary. Since no data is registered in the dictionary at the start of compression, input data 0x32 is registered in the dictionary in step 213. Furthermore, in step 214, hit-miss identifier (0b0) indicating that the same data does not exist in the dictionary (hit is missed) is added to input data 0x32 and stored in output compressed data buffer 104. Compressed data 0b0+0x32 stored in output compressed data buffer 104 is stored in a designated address of main storage memory 88 through bus interface 107.

Data characteristics analyzing unit 105 stores input data 0x32 with address 1 in the buffer as previous data in step 243.

Compression engine 84 applies a similar process to input data 0x29 with address 2, registers input data 0x29 in the dictionary of first compression engine 102, and stores compressed data 0b0+0x29 in a designated address of main storage memory 88. Data characteristics analyzing unit 105 stores input data 0x29 with address 2 in the buffer as the previous data.

Compression engine 84 further applies a similar process to input data 0x98 with address 3, registers input data 0x98 in the dictionary of first compression engine 102, and stores compressed data 0b0+0x98 in a designated address of main storage memory 88. Data characteristics analyzing unit 105 stores input data 0x98 with address 3 in the buffer as the previous data.

Next, compression engine 84 fetches input data 0x32 with address 4 to input uncompressed data buffer 101 in step 201 and determines whether the compression rule is the first compression rule in step 202. Here, since the value of compression rule selection table 106 is "A", first compression engine 102 starts a compression process.

First compression engine 102 determines in step 211 whether the same data as the input data exists in the dictionary. Here, since data 0x32 is already registered in the dictionary, hit identifier (0b1) indicative of the existence (hit) of the same data in the dictionary and dictionary entry number (0b0) corresponding to data 0x32 are stored in output compressed data buffer 104 in step 212. Compressed data 0b1+0b0 stored in output compressed data buffer 104 is stored in a designated address of main storage memory 88 through bus interface 107.

Data characteristics analyzing unit 105 determines in step 241 whether input data 0x32 and the previous data are the same. Here, since the previous data is 0x98, data 0x32 with address 4 is stored in the buffer as the previous data in step 243.

A similar process is applied to input data 0x98 with address 5. Hit identifier (0b1) and dictionary entry number (0b1) corresponding to data 0x98 are stored in output compressed data buffer 104, and compressed data 0b1+0b0 is stored in a designated address of main storage memory 88 through bus interface 107.

Data characteristics analyzing unit 105 stores input data 0x98 with address 5 in the buffer as the previous data in step 243.

Next, compression engine 84 fetches input data 0x00 with address 6 to input uncompressed data buffer 101 in step 201 and determines whether the compression rule is the first compression rule in step 202. Here, since the value of compression rule selection table 106 is "A", first compression engine 102 starts the compression process.

First compression engine 102 determines in step 211 whether the same data as the input data exists in the dictionary. Here, since data 0x00 is not registered in the dictionary, input data 0x00 is registered in the dictionary in step 213. Hit-miss identifier (0b0) is added to input data 0x00 in step 214 and stored in output compressed data buffer 104. Compressed data 0b1+0x00 stored in output compressed data buffer 104 is stored in a designated address of main storage memory 88 through bus interface 107.

Data characteristics analyzing unit 105 determines in step 241 whether input data 0x00 and the previous data are the same. Here, since the previous data is 0x98, data 0x00 with address 6 is stored in the buffer as the previous data in step 243.

Next, compression engine 84 fetches input data 0x00 with address 7 to input uncompressed data buffer 101 in step 201 and determines whether the compression rule is the first compression rule in step 202. Here, since the value of compression rule selection table 106 is "A", first compression engine 102 starts the compression process.

First compression engine 102 determines in step S211 whether the same data as the input data exists in the dictionary. Here, since data 0x00 is already registered in the dictionary, hit identifier (0b1) and dictionary entry number (0b2) corresponding to data 0x00 are stored in output compressed data buffer 104 in step 212. Compressed data 0b1+0b2 stored in output compressed data buffer 104 is stored in a designated address of main storage memory 88 through bus interface 107.

Data characteristics analyzing unit 105 determines in step 241 whether input data 0x00 and the previous data are the same. Here, since the previous data is also 0x00, the value of compression rule selection table 106 is changed to "B".

Therefore, in the compression process for the following data 0x00 with address 8, the value of compression rule selection table 106 is determined as "B" in step 202. Thus, second compression engine 103 starts compressing the input data. In other words, in the exemplary embodiment, the compression rule automatically changes from the first compression rule to the second compression rule when the same data succeeds twice.

Second compression engine 103 determines in step 221 whether input data 0x00 and the previous data stored in the buffer of data characteristics analyzing unit 105 are the same. Here, since the previous data is also 0x00, whether the value of the iteration counter has reached a preset specified value is determined in step 222. In RLE, when different data is inputted after the same data is consecutively inputted, information indicating the number of the same data inputted so far (value of iteration counter) and hit identifier (0b1) are outputted as compressed data. In the exemplary embodiment, an upper value (the specified value) is set for the value of the iteration counter, and if the same data is consecutively inputted for more than the specified value, the value of the iteration counter is outputted as the compressed data at that point. The specified value is set in accordance with the bit length of the iteration counter, and for example, the specified value is "15" when the bit length of the iteration counter is "4".

Here, since the value of the iteration counter is "0", second compression engine 103 adds "1" to the value of the iteration counter in step 223, returns to the process of step 201 without outputting any compressed data, and fetches input data 0x00 with address 9.

A similar process is applied to input data 0x00 with address 9. Second compression engine 103 sets the value of the iteration counter to "2", returns to the process of step 201 without outputting any compressed data, and fetches input data 0x41 with address 10.

After fetching data 0x41 with address 10, compression engine 84 determines in step 202 whether the compression rule is the first compression rule. Here, since the value of compression rule selection table 106 is also "B", second compression engine 103 starts compressing the input data.

Second compression engine 103 determines in step 221 whether input data 0x41 and the previous data stored in the buffer of data characteristics analyzing unit 105 are the same. Here, since the previous data is 0x00, whether the value of the iteration counter is "0" is determined in step 226. Here, since the value of the iteration counter is "2", second compression engine 103 stores hit identifier (0b1) and the value of the iteration counter "2" (=0x2) in output compressed data buffer 104 as the compressed data in step 227 and turns back the value of the iteration counter to "0" in step 228. Compressed data 0b1+0x2 stored in output compressed data buffer 104 is stored in a designated address of main storage memory 88 through bus interface 107. Compressed data 0b1+0x2 outputted from second compression engine 103 in step 227 indicates the compression result of input data with addresses 8 and 9.

Subsequently, second compression engine 103 provides hit-miss identifier (0b0) to input data 0x41 with address 10 in step 229 and stores the data in output compressed data buffer 104. Therefore, compressed data corresponding to address 10 are 0b1+0x2 and 0b0+0x41.

Data characteristics analyzing unit 105 stores data 0x41 with address 10 in the buffer as the previous data in step 230 and changes the value of compression rule selection table 106 to "A" in step 244. Thus, in the exemplary embodiment, the compression rule automatically changes from the second compression rule to the first compression rule when the consecutively inputted same data switches to different input data.

In the following compression process for data 0x32 with address 11, the value of compression rule selection table 106 is determined as "A" in step 202, and first compression engine 102 compresses the input data. At this point, since data 0x32 exists in the dictionary, first compression engine 102 executes a similar process as for the data with address 4. In the compression process for data 0x16 with address 12, the value of compression rule selection table 106 is determined as "A" in step 202, and first compression engine 102 compresses the input data. At this point, since data 0x16 does not exist in the dictionary, first compression engine 102 executes a similar process as for the data with address 1.

Next, a processing procedure of the data decompression method of the present invention will be described using FIG. 8.

Figure 8:
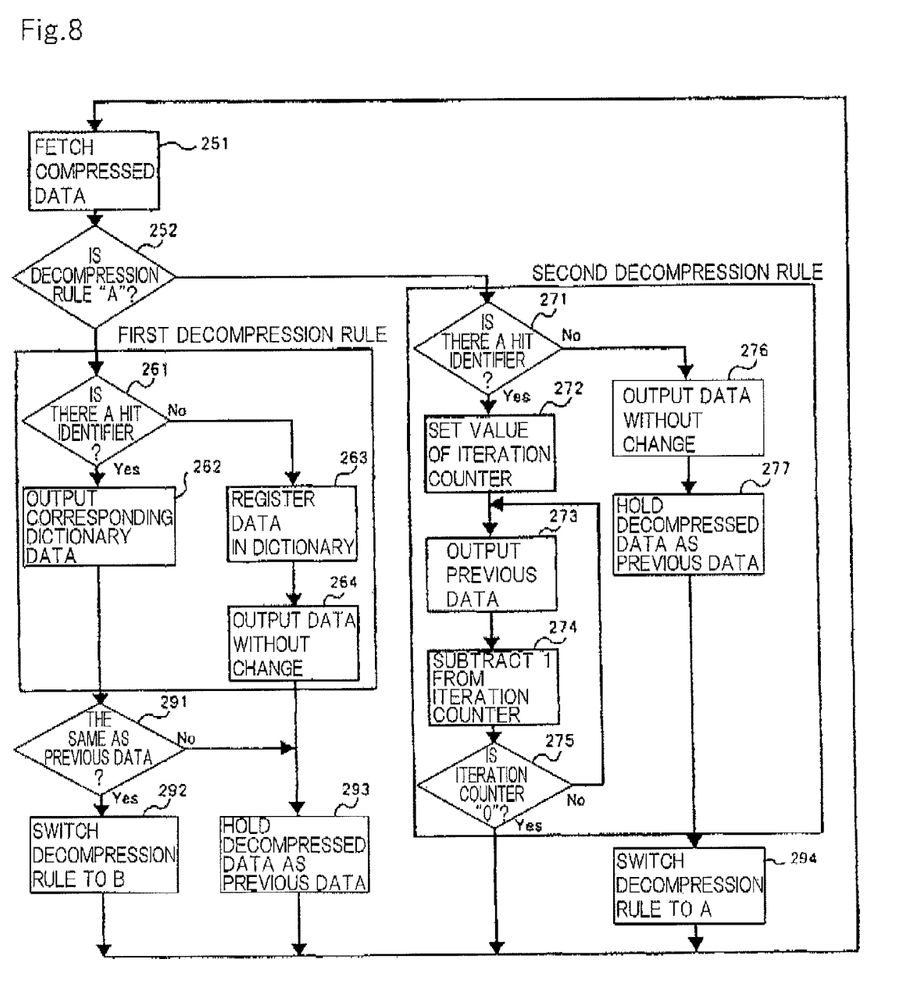
FIG. 8 is a flow chart showing an example of a processing procedure of a decompression method of the present invention.

FIG. 8 is a flow chart showing an example of a processing procedure of the decompression method of the present invention. Here, an example of decompressing compressed data shown in Table 1 to original input data in the same way as in the compression process shown in FIG. 7 will be described.

In the exemplary embodiment, the first decompression process corresponding to the first compression rule is used at the start of the decompression process. Therefore, decompression rule selection table 126 stores in advance the value "A" indicating the first decompression rule.

When the decompression process starts, decompression engine 85 first fetches compressed data 0b0+0x32 corresponding to address 1 to input compressed data buffer 124 in step 251 and determines whether the decompression rule is the first decompression rule in step 252. Here, since the value stored in decompression rule selection table 126 is "A", first decompression engine 122 starts the decompression process.

First decompression engine 122 determines in step 261 whether the compressed data includes a hit identifier. Here, since the compressed data includes hit-miss identifier (0b0), data 0x32 is registered in the dictionary in step 263, and data 0x32 is stored in output uncompressed data buffer 121 without change in step 264. Data 0x32 stored in output uncompressed data buffer 121 is stored in a designated address of main storage memory 88 through bus interface 127.

Data characteristics analyzing unit 125 determines in step 291 whether data 0x32 after decompression is the same as the previous data. Since nothing is registered in the previous data at the start of the decompression, data 0x32 is stored in the buffer as the previous data in step 293.

Decompression engine 85 also applies a similar process to compressed data 0b0+0x29 corresponding to address 2, registers data 0x29 in the dictionary, and stores data 0x29 in a designated address of main storage memory 88. Data characteristics analyzing unit 125 stores data 0x29 in the buffer as the previous data.

Decompression engine 85 also applies a similar process to compressed data 0b0+0x98 corresponding to address 3, registers data 0x98 in the dictionary, and stores data 0x98 in a designated address of main storage memory 88. Data characteristics analyzing unit 125 stores data 0x98 in the buffer as the previous data.

Next, decompression engine 85 fetches compressed data 0b1+0b0 with address 4 to input compressed data buffer 124 in step 251 and determines whether the decompression rule is the first decompression rule in step 252. Here, since the value of decompression rule selection table 126 is also "A", first decompression engine 122 starts the decompression process of the compressed data.

First decompression engine 122 determines in step 261 whether the compressed data includes a hit identifier. Here, since the compressed data includes hit identifier (0b1), data 0x32 corresponding to dictionary entry number "0" (0b0) is stored in output uncompressed data buffer 121 in step 262. Data 0x32 stored in output uncompressed data buffer 121 is stored in a designated address of main storage memory 88 through bus interface 127.

Data characteristics analyzing unit 125 determines in step 291 whether data 0x32 and the previous data are the same. Here, since the previous data is 0x98, data 0x32 is stored in the buffer as the previous data in step 293.

Decompression engine 85 also applies a similar process to compressed data 0b1+0b1 corresponding to address 5, registers data 0x98 in the dictionary, and stores data 0x98 corresponding to dictionary entry number "1" (0b1) in a designated address of main storage memory 88. Data characteristics analyzing unit 125 stores data 0x98 in the buffer as the previous data.

Next, decompression engine 85 fetches compressed data 0b0+0x00 with address 6 to input compressed data buffer 124 in step 251 and determines whether the decompression rule is the first decompression rule in step 252. Here, since the value of decompression rule selection table 126 is also "A", first decompression engine 122 starts the decompression process of the input data.

First decompression engine 122 determines in step 261 whether the compressed data includes a hit identifier. Here, since the compressed data includes hit-miss identifier (0b0), data 0x00 is stored in output uncompressed data buffer 121 without change in step 264. Data 0x00 stored in output uncompressed data buffer 121 is stored in a designated address of main storage memory 88 through bus interface 127.

Data characteristics analyzing unit 125 determines in step 293 whether data 0x00 after decompression is the same as the previous data. Here, since the previous data is 0x98, data 0x00 is stored in the buffer as the previous data in step 293.

Next, decompression engine 85 fetches compressed data 0b1+0b2 with address 7 to input compressed data buffer 124 in step 251 and determines whether the decompression rule is the first decompression rule in step 252. Here, since the value of decompression rule selection table 126 is also "A", first decompression engine 122 starts the decompression process of the input data.

First decompression engine 122 determines in step 261 whether the compressed data includes a hit identifier. Here, since the compressed data includes hit identifier (0b1), data 0x00 corresponding to dictionary entry number "2" is stored in output uncompressed data buffer 121 in step 262, and the value of decompression rule selection table 126 is changed to "B" in step 292. Data 0x00 stored in output uncompressed data buffer 121 is stored in a designated address of main storage memory 88 through bus interface 127.

Subsequently, decompression engine 85 shifts to fetching of compressed data corresponding to address 8 in step 251. However, since there is no compressed data corresponding to address 8, decompression engine 85 does not execute any process and shifts to fetching of compressed data corresponding to address 9. Since there is no compressed data corresponding to address 9 either, decompression engine 85 does not execute any process and shifts to fetching of compressed data corresponding to address 10.

After fetching data 0b1+0x2 with address 10 to input compressed data buffer 124 in step 251, decompression engine 85 determines whether the decompression rule is the first decompression rule in step 252. Here, since the value of decompression rule selection table 126 is "B", second decompression engine 123 starts the decompression process of the input data.

Second decompression engine 123 determines in step 271 whether the compressed data includes a hit identifier. Here, since the compressed data includes hit identifier (0b1), the value of the iteration counter is set to "2" based on the following compressed data 0x2 (step 272).

Subsequently, second decompression engine 123 stores the previous data 0x00 in output uncompressed data buffer 121 in step 273, subtracts "1" from the value of the iteration counter in step 274, and determines whether the value of the iteration counter is "0" in step 275. Here, since the value of the iteration counter is "1", the process returns to step 273. Previous data 0x00 is stored again in output uncompressed data buffer 121, and the processes of steps 274 and 275 are repeated. Two data 0x00 stored in output uncompressed data buffer 121 are stored in designated addresses of, main storage memory 88 through bus interface 127, respectively.

If the value of the iteration counter is "0" in step 275, decompression engine 85 returns to the process of step 251 and fetches compressed data 0b0+0x41 to input compressed data buffer 124.

After fetching compressed data 0b0+0x41 with address 10 to input compressed data buffer 124 in step 251, decompression engine 85 determines whether the decompression rule is the first decompression rule in step 252. Here, since the value of decompression rule selection table 126 is "B", second decompression engine 123 starts the decompression process of the input data.

Second decompression engine 123 determines in step 271 whether the compressed data includes a hit identifier. Here, since the compressed data includes hit-miss identifier (0b0), the following data 0x41 is stored in output uncompressed data buffer 121 without change (step 276), and data 0x41 is stored in the buffer as the previous data in step 277.

Data characteristics analyzing unit 125 changes the value of decompression rule selection table 126 to "A" in step 294. Data 0x41 stored in output uncompressed data buffer 121 is stored in a designated address of main storage memory 88 through bus interface 127.

Subsequently, the compressed data corresponding to addresses 11 and 12 are decompressed by the first decompression rule in the same way as for the preceding data.

Although the description illustrates an example of using the first compression rule at the start of the compression process and using the first decompression rule corresponding to the first compression rule at the start of the decompression process, the values of compression rule selection table 106 and decompression rule selection table 126 may be set before the start of the process, and a compression rule and a decompression rule used at the start of the compression process may be arbitrarily selected from a plurality of types of prepared compression rules. Such a process may be easily realized by allocating an arbitrary register (storage device) for compression rule selection table 106 and decompression rule selection table 126 if, for example, a microprocessor, which executes a process according to a program, realizes the data compression/decompression method of the present invention.

Furthermore, if information indicating the compression rule used at the start of the compression is added to the top of the compressed data, a decompression rule corresponding to the compression rule is selected at the start of the decompression process. Therefore, there is no need for the operator to set the decompression rule.

Furthermore, if information for switching the compression rule is added to the compression target data, the compression rule can be more flexibly switched. For example, even if the value of the iteration counter is "0" in the process of step 226 shown in FIG. 7, a switch to the first compression rule is made and the processes after step 229 are executed as long as information for switching to the first compression rule is added to the data. In that case, if the data outputted in step 229 exists in the dictionary used in the first compression rule, the data is compressed according to the first compression rule, and the compression rate further improves.

By the way, in the processing procedure of the data decompression method shown in FIG. 8, data characteristics analyzing unit 125 analyzes the data after decompression, and then the decompression rule is switched. Therefore, if decompression of the compressed data is not finished, the decompression rule of the following compressed data cannot be determined. Thus, in the processing procedure of the data decompression method shown in FIG. 8, it is difficult to, for example, pipeline the processes for realizing a high-speed decompression process.

Therefore, if there is a possibility of changing the decompression rule, one of the following methods may be applied to the following compressed data without waiting for the end of analysis of the preceding data after decompression.

(1) Use one of the decompression rules for decompression.
(2) Simultaneously decompress by a plurality of decompression rules.

Here, as a result of the analysis of the preceding data after decompression, if it is found that a wrong decompression rule is applied to the following compressed data to decompress the compressed data, the following can be earned out.

(3) If (1) is implemented, execute a decompression process again by using the right decompression rule corresponding to the compression rule.
(4) If (2) is implemented, only the data restored by the right decompression rule corresponding to the compression rule is outputted.

However, the dictionary and various history data (such as iteration counter) used in a decompression process that does not correspond to (3) and (4) need to be returned to the original values. Therefore, hardware or a program for executing the process is necessary.

Furthermore, in the processing procedure of the data compression method shown in FIG. 7, the first compression rule is switched to the second compression rule when the same data is inputted twice in a row, and if for example, different data is inputted immediately after the switch from the first compression rule to the second compression rule, the compression rule is frequently switched. When the compression rule is frequently switched, a predetermined specific number of times may be set for the number of times the same data is consecutively inputted as a condition for switching the compression rule, and when the switching condition occurs for the specific number of times, such as when the same data is inputted three times in a row, the first compression rule may be switched to the second compression rule. Even if the switching condition is changed this way, the data can be correctly restored if the decompression rule is changed under the same condition during the decompression.

As described, according to the data compression/decompression method of the present invention, a plurality of different compression rules can be automatically switched to compress/decompress data. Therefore, data with various characteristics can be efficiently compressed using compression rules suitable for the characteristics. Furthermore, data can be compressed/decompressed without incorporating unnecessary control codes in the data after compression, or just by incorporating minimum control codes.

Furthermore, since the compression rule automatically changes, degradation of compression efficiency can be prevented when a large number of changes are made, and a change in the compression rule that degrades the compression efficiency can also be prevented.

Furthermore, compression engines that realize a plurality of compression rules do not have to be simultaneously operated during compression or decompression, and power consumption can be reduced.

This application claims the benefit of priority based on Japanese Patent Application No. 2007-210761 filed Aug. 13, 2007, the entire disclosure of which is hereby incorporated by reference.

The invention claimed is:

1. A compression/decompression method for a compression engine to compress data and a decompression engine to decompress compressed data, wherein
said compression engine is configured to:
start compressing data according to a first compression rule used at the start of a preset data compression process and analyze characteristics of the data;
when the characteristics of the data satisfy a preset switching condition, compress data following the data according to a second compression rule different from said first compression rule; and
when the characteristics of the data do not satisfy said switching condition, compress the data and the following data according to said first compression rule, and
said decompression engine is configured to:
start decompressing compressed data according to a first decompression rule corresponding to said first compression rule;
when the characteristics of the data after decompression satisfy said switching condition, decompress compressed data following the data according to a second decompression rule corresponding to said second compression rule; and
when the characteristics of the data after decompression do not satisfy said switching condition, decompress the data and the following compressed data according to said first decompression rule; and said switching condition is that the same data succeeds for a plurality of times.

2. The data compression/decompression method according to claim 1, wherein
said first compression rule is a dictionary-based compression method, and
said switching condition is that the same data succeeds for a plurality of times.

3. The data compression/decompression method according to claim 1, wherein
said second compression rule is a run length encoding method.

4. The data compression/decompression method according to claim 1, wherein
when a first compression rule used at the start of the compression process is set from a plurality of types of prepared compression rules, said compression engine is configured to store information indicative of said first compression rule in said storage device, and
said decompression engine is configured to start decompressing the compressed data according to a first decompression process corresponding to said first compression rule based on the information stored in said storage device.

5. The data compression/decompression method according to claim 1, wherein
when a first compression rule used at the start of the compression process is set from a plurality of types of prepared compression rules, said compression engine is configured to add information indicative of said first compression rule to the compressed data, and
said decompression engine is configured to start decompressing the compressed data according to a first decompression process corresponding to said first compression rule based on the information added to said compressed data.

6. The data compression/decompression method according to claim 1, wherein
said compression engine is configured to add information, for switching the compression rule to said second compression rule, to the compressed data when the characteristics of the data satisfy said switching condition, and
said decompression engine is configured to change the decompression rule from said first decompression rule to said second decompression rule based on the information added to said compressed data to decompress the compressed data.

7. The data compression/decompression method according to claim 1, wherein
said decompression engine is configured to:
determine whether the preceding data after decompression satisfies said switching condition and decompress the following compressed data according to a preset decompression rule;
when the preceding data after decompression does not satisfy said switching condition, discard the following data after decompression and decompress compressed data corresponding to the data according to said first decompression rule; and
when the preceding data after decompression satisfies said switching condition, output the following data after decompression without change.

8. The data compression/decompression method according to claim 1, wherein
said decompression engine is configured to:
determine whether the preceding data after decompression satisfies said switching condition and decompress the following compressed data according to a plurality of types of preset decompression rules; and
output one of the data after decompression based on the plurality of types of decompression rules applied to said following compressed data depending on the determination result indicating whether said switching condition for the preceding data after decompression is satisfied.

9. The data compression/decompression method according to claim 1, wherein
said compression engine is configured to change said switching condition when said switching condition reaches a preset specified value related to the number of times of switching of the compression rules.

* * * * *